US007171598B2

(12) United States Patent
Cullen et al.

(10) Patent No.: US 7,171,598 B2
(45) Date of Patent: Jan. 30, 2007

(54) TESTER SYSTEM HAVING A MULTI-PURPOSE MEMORY

(75) Inventors: Jamie S. Cullen, Sunnyvale, CA (US); Burnell G. West, Half Moon Bay, CA (US)

(73) Assignee: Credence Systems Corporation, Milpitas, CA (US)

( * ) Notice: Subject to any disclaimer, the term of this patent is extended or adjusted under 35 U.S.C. 154(b) by 601 days.

(21) Appl. No.: 10/435,494

(22) Filed: May 8, 2003

(65) Prior Publication Data
US 2004/0039977 A1    Feb. 26, 2004

Related U.S. Application Data

(60) Provisional application No. 60/379,355, filed on May 8, 2002.

(51) Int. Cl.
G01R 31/28 (2006.01)
G01R 31/26 (2006.01)

(52) U.S. Cl. ...................... 714/724; 324/765
(58) Field of Classification Search .............. 714/724, 714/718, 735, 738; 324/763, 765
See application file for complete search history.

(56) References Cited

U.S. PATENT DOCUMENTS 5,737,512 A * 4/1998 Proudfoot et al. ............ 714/32

| | | | |
|---|---|---|---|
| 6,021,515 A | 2/2000 | Shimura | |
| 6,092,225 A | 7/2000 | Gruodis et al. | |
| 6,161,206 A | 12/2000 | Wasson | |
| 6,286,120 B1 * | 9/2001 | Reichert et al. | 714/738 |
| 6,484,282 B1 * | 11/2002 | Tsuto | 714/738 |
| 6,499,126 B1 * | 12/2002 | Tsuto | 714/738 |
| 6,826,721 B2 * | 11/2004 | Williamson et al. | 714/725 |
| 2004/0059437 A1 * | 3/2004 | Cullen et al. | 700/11 |

FOREIGN PATENT DOCUMENTS

DE    199 51 205 A1    4/2000
DE    100 31 528 A1    2/2001

OTHER PUBLICATIONS

"Reducing Test Application Time in High-level Test Generation" by Ravi et al. International Test Conference Proceedings, 2000 Publication Date: Oct. 3-5, 2000 pp. 829-838 INSPEC Accession No. 6859172.*
International Search Report, International Application No. PCT/US03/14891, Sep. 18, 2003, pp. 1-2.

* cited by examiner

Primary Examiner—Cynthia Britt
(74) Attorney, Agent, or Firm—Fish & Richardson P.C.

(57) ABSTRACT

An apparatus for testing an integrated circuit, the apparatus including a sequence control logic unit having an output channel connectable to a device under test, and a memory to store at least two types of data sets, each data set being used by the sequence control logic unit to determine a test pattern to output on the output channel.

35 Claims, 3 Drawing Sheets

TESTER SYSTEM HAVING A MULTI-PURPOSE MEMORY

CLAIM OF PRIORITY

This application claims priority under 35 USC §119(e) to U.S. Patent Application Ser. No. 60/379,355, filed on May 8, 2002, the entire contents of which are hereby incorporated by reference.

BACKGROUND

This application relates to integrated circuit testing.

In a typical integrated circuit testing system a sequence of test patterns (a "test sequence") is applied to the pins of a device under test (DUT). Many different types of test patterns may be used to test different logic sections contained with a particular DUT, for example, Scan patterns, Functional patterns, Algorithmic patterns and Analog patterns. Some types of test patterns are applied to a DUT pin in a serial fashion (e.g., scan patterns) and others are applied to a set of pins in parallel (e.g., functional patterns, analog patterns and algorithmic patterns). Depending on the architecture of the DUT, a test sequence may include outputting a combined test pattern, i.e., outputting more than one type of test pattern at the same time to different pins of a DUT.

During a test sequence a DUT may output test "results" from an output pin. Therefore, a testing system may include one or more input channels connected to a DUT to receive test results during a test sequence.

SUMMARY

Figure 1:
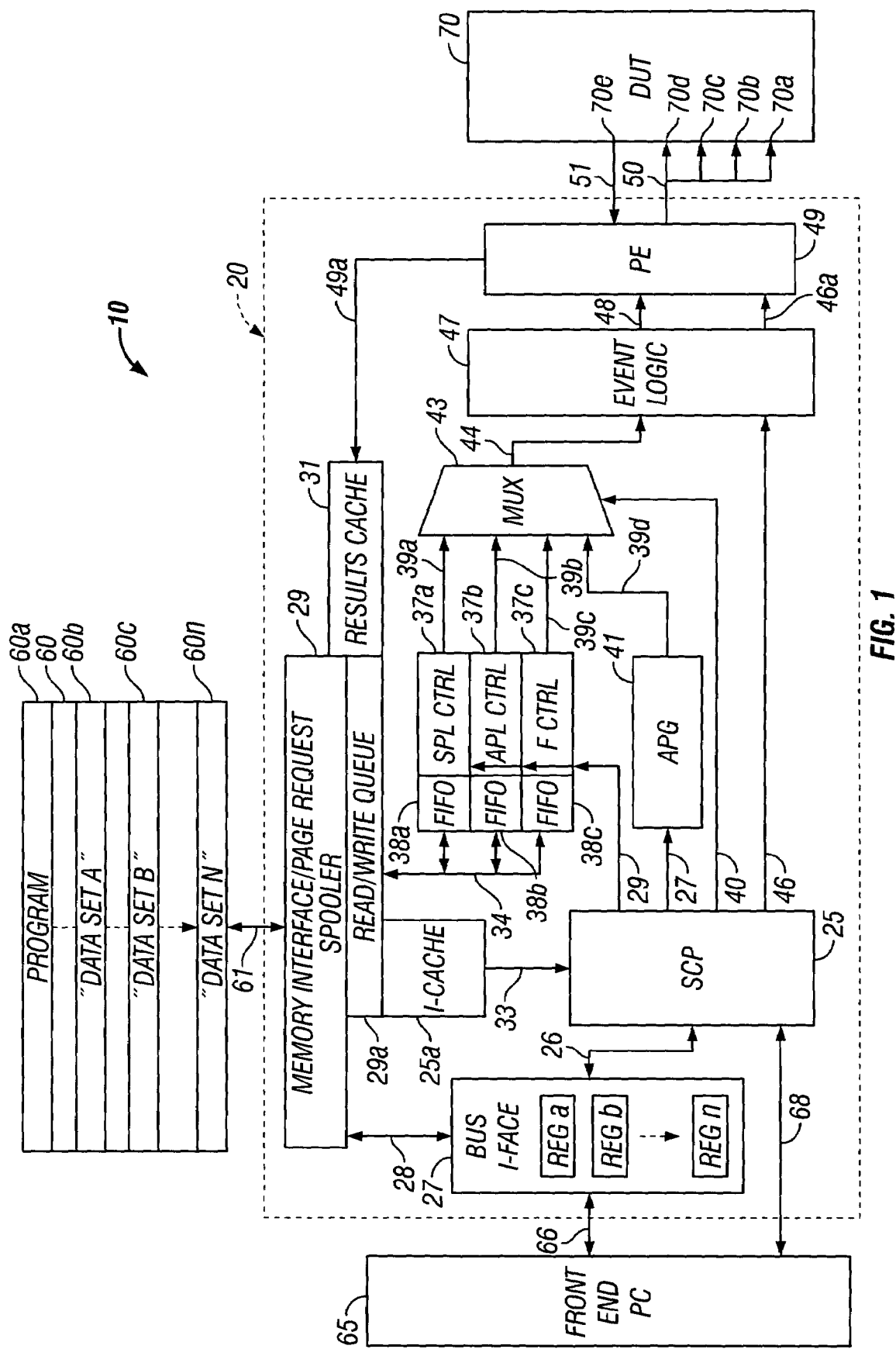
FIG. 1 is a block diagram showing a first embodiment of an integrated circuit testing system.

According to an aspect of this invention, an apparatus for testing an integrated circuit, the apparatus including a sequence control logic unit having an output channel connectable to a device under test, and a memory to store at least two types of data sets, each data set being used by the sequence control logic unit to determine a test pattern to output on the output channel.

One or more of the following features may also be included: wherein the memory is further configured to store at least one test sequence program including instructions executable by the sequence control logic unit, wherein, during operation of the apparatus, the test sequence program is executed by the sequence control logic unit. Wherein the sequence control logic unit further includes a memory interface having a read/write queue connected to receive memory access requests from at least two separate requesters. Wherein the sequence control logic unit further comprises an instruction cache connected to receive and to hold executable instructions from the memory interface. Wherein the sequence control logic unit further includes a plurality of data buffers, each data buffer being associated with a requester, each data buffer further being configured to store data received from the memory interface. Wherein the memory is further configured to store test results received from the device under test. The apparatus further including a results cache to store test results received from the device under test. Wherein the sequence control logic unit further includes a plurality of pattern control logic blocks, at least one of the plurality of pattern control logic blocks configured to output a test pattern based on data received from a one of the two data sets stored in the memory. Wherein the test data sets stored in the memory comprise at least one of a data set representing functional data, scan data, and digitized analog data. The apparatus further including a front end processor connected to the memory interface, the front end processor configured to load the data sets and the executable test sequence programs prior to the execution of the program. The apparatus further including a plurality of selection multiplexors to receive at least one output bit from a corresponding one of the plurality of pattern control logic block, and a data selection logic block to control an output of each of the plurality of selection multiplexors. Wherein the data selection logic block determines the selection codes for each of the plurality of selection multiplexors based on a portion of an instruction stored in the memory as part of the test sequence program. Wherein the data selection logic block includes an indexed table, and wherein the data selection logic block is connected to receive an index based on the portion of the instruction. The apparatus further including a second sequence control logic unit having a second output channel that is connectable to input pins of a device under test, and a second memory to store at least one type of data set and a second executable test program, each data set stored in the second memory usable by the second sequence control logic unit to determine a test pattern to be output on the second output channel. The apparatus further including a control line connecting the front end processor and the first and second sequence control logic units, wherein, during operation of the apparatus, the control line is used to send a synchronization signal to both the first and second control units to coordinate execution of the first and second test sequence programs and to coordinate output of test patterns to a single device under test connectable to the output channels of the first and second sequence control units.

According to a further aspect of this invention, an article including a storage medium having stored thereon instructions that when executed by a machine results in the following: storing at least two types of data sets in a memory, each data set usable by a sequence control logic unit to determine a test pattern to be output by one or more output channels that are connectable to input pins of a device under test.

One or more of the following features may also be included: Wherein storing further includes storing at least one test sequence program in the memory, the test sequence program including instructions executable by the sequence control logic unit. The article further includes queueing memory access requests from requestors at an interface to the memory. The article further including storing instructions received from the memory interface in an instruction cache. The article further includes storing data received from the memory interface in a plurality of data buffers, each data buffer being associated with a one of the requesters. The article further includes storing test results received from the device under test in the memory. The article wherein storing further includes storing test results received from the device under test in a results cache, and writing the stored test results from the results cache to the memory interface. The article further includes outputting a test pattern from at least one of a plurality of pattern control logic blocks to the output channel, the test pattern based on data received from a data set stored in the memory. The article further includes receiving at each of a plurality of multiplexors at least one output bit from a corresponding one of the plurality of pattern control logic blocks, and selecting at least one output bit from each of the plurality of multiplexors. The article wherein selecting further includes determining a selection code for each of the plurality of multiplexors based on a portion of an instruction stored in the memory as part of the test sequence program.

According to a further aspect of this invention a method of testing an integrated circuit including storing at least two types of data sets in a memory, each data set usable by a sequence control logic unit to determine a test pattern to be output by one or more output channels that are connectable to input pins of a device under test.

One or more of the following features may also be included: Wherein storing further includes storing at least one test sequence program in the memory, the test sequence program including instructions executable by the sequence control logic unit. The method further includes queueing memory access requests from requesters at an interface to the memory. The method further includes storing instructions received from the memory interface in an instruction cache. The method further includes storing data received from the memory interface in a plurality of data buffers, each data buffer being associated with a one of the requesters. The method further includes storing test results received from the device under test in the memory. The method wherein storing further includes storing test results received from the device under test in a results cache, and writing the stored test results from the results cache to the memory interface. The method further includes outputting a test pattern from at least one of a plurality of pattern control logic blocks to the output channel, the test pattern based on data received from a data set stored in the memory. The method further includes receiving at each of a plurality of multiplexors at least one output bit from a corresponding one of the plurality of pattern control logic block, and selecting at least one output bit from each of the plurality of multiplexors. Wherein selecting further includes determining a selection code for each of the plurality of multiplexors based on a portion of an instruction stored in the memory as part of the test sequence program.

Embodiments of the invention may have one or more of the following advantages. For example, the use of a single multi-purpose memory reduces the cost of the apparatus because separate memories are not required for each different type of test pattern required for testing a DUT. Furthermore, the use of a single multi-purpose memory may increase the reliability of the apparatus because the number of separate components is reduced, i.e. the number of memories and separate logic blocks for each type of test pattern can be reduced. Also, the programming and use of the apparatus is relatively simple in comparison to the use of systems having multiple, partitioned memories because only one memory needs to be loaded from a single source.

DESCRIPTION

Referring to FIG. 1, an integrated circuit testing system 10 for testing a device under test (DUT 70) includes a block of sequence control logic 20 (SCL 20), a multipurpose memory 60, a front end processor 65 (FEP 65), an output channel 50 and an input channel 51. During operation of system 10, an executable test sequence program 60a and sets of test data 60b–60n are loaded into memory 60. Each set of test data 60b–60n may correspond to a different type of test pattern required to test a section of logic contained within DUT 70. Following the loading of memory 60, instructions from program 60a are read and executed by SCL 20, and blocks of data from one or more of the data sets 60b–60n are read and used by SCL 20 to generate and output combined test patterns from output channel 50 to DUT 70.

Conventional testing systems often included separate blocks of logic for the generation of each specific test pattern required for testing a DUT. Typically, each separate pattern-specific logic block included a separate memory for the storage of data sets and/or algorithmic information required to produce that specific type of test pattern. By contrast, system 10 includes only one multi-purpose memory 60 that may be used to store multiple data sets, where each data set corresponds to a different type of test pattern that may be required to test a DUT. Memory 60 is also be used to store one or more executable test sequence programs for system 10. Moreover, memory 60 may also be used to store test results ("Captures" or "Fails"), i.e., outputs received from a DUT during testing. The use of a unified, multi-purpose memory reduces the cost of system 10 because separate memories are not required for each different type of test pattern required for testing a DUT. Furthermore, the use of a unified memory may increase the reliability of system 10 because the number of separate components is reduced, i.e. the number of memories and separate logic blocks for each type of test pattern can be reduced. Also, the programming and use of system 10 is relatively simple in comparison to the use of systems having multiple, partitioned memories because only one memory needs to be loaded from a single source (e.g., front end processor 65).

Still referring to FIG. 1, SCL 20 includes a sequence control processor 25 (SCP 25) that executes test sequence program 60a and also controls the outputs of a series of pattern control logic blocks 37a–37c (PCLs 37a–37c) and an algorithmic pattern generator block 41 (APG 41). APG 41, when enabled by SCP 25, produces output bit patterns that are based on an algorithm that may be implemented in hardware or by a software program that is loaded into APG 41 before or during execution of program 60a. The particular algorithm used depends on the type of testing desired and the specifics of the DUT. SPL control block 37a refers to a control block that determines appropriate SCAN bits to output based on a data set. APL control block 37b refers to a control block that determines appropriate digitized-analog bits to output based on a data set. F CTRL 37c refers to a control block that determines appropriate functional data bits to output based on a data set.

PCLs 37a–37c are connected to receive blocks of data from the data sets 60b–60n stored in memory 60. Outputs 39a–39d of PCLs 37a–37c and APG 41 are input to a selector multiplexor 43 (MUX 43). A combined bit pattern is output from MUX 43 on bus 44, the combined bit pattern selected is controlled by a control line 40 from SCP 25. The combined bit pattern on bus 44 is then sent through an event logic block 47, and a pin electronics block 49. SCP 25 is connected to send a function signal to event logic 47 on control line 46. The function signal on line 46 is used by event logic 47 and pin electronics 49 to determine the appropriate output signal characteristics required by DUT 70. In more detail, functional signal 46 is used by event logic 47 and pin electronics 49 to determine the appropriate operational characteristics of the output signals sent to DUT 70, e.g., the timing, voltage level and/or current level required by each pin of DUT 70 connected to an output channel 50.

To access memory 60, SCL 20 includes a memory interface/page request spooler 29 (MIPRS 29) that is connected to memory 60 by memory bus 61. MIPRS 29 includes a read/write queue 29a that is connected to receive data and instruction read/write requests from various logic blocks ("requesters") within SCL 20. Read/write queue 29a allows MIPRS 29 to hold multiple read/write requests and then process those requests in turn. In this implementation of system 10, requestors include SCP 25 (which requests instructions from program 60a), PCLs 37a–37c (each of which may request data from data sets 60b–60n) and PE 49 (which may request data writes when results are received on input channel 51 from DUT 70). Each requester also includes an associated cache [or buffer] (e.g., a set of FIFO registers) to hold a buffer of data or instructions that is sufficient to allow a first requestor to continue operation while MIPRS 29 is processing read or write requests from a second requester. In more detail, SCL 20 includes an instruction cache 25a and a results cache 31 both connected to MIPRS 29, which are used to store instructions read from memory 60 and results data to be written to memory 60, respectively. Similarly, each PCL 37a–37c includes FIFO registers 38a–38c that are used to hold test data read from memory 60 and received from MIPRS 29 on bus 34.

SCL 20 also includes a bus interface block 27 that is connected to MIPRS 29 by bus 28. Bus interface block 27 is also connected to front end processor 65 by bus 66 and sequence control processor 25 (SCP 25) by bus 26. During operation of system 10, front end processor 65 loads a test sequence program 60a and test data sets 60b–60n into memory 60 by transmitting the program and data sets through bus-interface 27 and MIPRS 29.

Typically, before test sequence program 60a and data sets 60b–60n are loaded into memory 60, a programmer ("a user") specifies the test patterns required to test DUT 70. The user may execute a test sequence generation program on front end processor 65. The test sequence generation program allows the user to make DUT testing selections via an input/output device (e.g., a keyboard or mouse, not shown) connected to front end processor 65. In more detail, the test sequence generation program allows the user to select and specify the type of test pattern required for each pin of DUT 70 and the number of sequential patterns to output to DUT 70 during the execution of the test program (a "test sequence"). The user may also select and specify the expected results from a DUT output pin during a test sequence. Based on the user's selections, test sequence generation program assembles the test sequence program 60a so that an appropriate test pattern for each specified DUT pin will be output at the appropriate time during execution of test sequence program 60a by SCL 20. The user may also specify the physical characteristics of DUT 70, for example, the clock speed and/or the operational voltage levels required by DUT 70. In this case, the test sequence program 60a will also include commands (or command fields) that reflect the physical characteristics of the DUT so that the test pattern signals output from SCL 20 and input to the DUT will be "conditioned" to match the operational signal requirements of the DUT, as will be explained.

Bus interface 27 includes several registers, REGa–REGn, that are used by front end processor 65 to store the starting addressing of program 60a and the starting ("base") address for each data set stored in memory 60. The base address and size of each data set may vary. During operation of system 10, front end processor 65 writes the base address for each data set into one of the registers, REGa–REGn, before the data set is written to memory 60. The base address is forwarded to MIPRS 29, which uses the base address to determine the location of subsequent writes of the data set. MIPRS 29 also uses the base address for each data set to determine the location of subsequent reads received from pattern control blocks 37a–37c, i.e., determining subsequent read addresses within a data set relative to the base address for each data set.

Front end processor 65 is connected to send command signals to SCP 25 by signal bus 68. After test sequence program 60a and test data 60b–60n are loaded into memory 60, front end processor 65 sends a "START" signal to SCP 25 on signal bus 68, which causes SCP 25 to begin execution of test sequence program 60a. When SCP 25 receives the 'START' signal from FEP 65, SCP 25 sends the starting address of program 60a (stored in one of the registers, REGa–REGn) to MIPRS 29. MIPRS 29 reads a block of instructions from program 60a beginning at the starting address sent and then forwards the instructions read to instruction cache 25a, which in turn forwards those instructions to SCP 25 on instruction bus 33.

As described previously, registers REGa–REGn are used to store the base address for each set of test data 60b–60n stored in memory 60. Once SCP 25 begins execution of program 60a, SCP 25 reads and forwards those base addresses to MIPRS 29 through bus interface 27 to initiate a first read request for each required data set. Subsequent read requests are sent to MIPRS 29 from a requesting PCL 37a–37c that requires additional data from a data set 60b–60n. Similarly, SCP 25 sends an instruction read request to MIPRS 29 when additional instructions are required by SCP 25. Each read request received by MIPRS 29 causes MIPRS 29 to read a page of data or instructions from the test data set 60b–60n and return a page of data to the requester. "Page" refers to a block size of data or instructions that each requester is able to store in its associated buffer. Each requester may have a different page size.

SCP 25 is connected by control line 29 to control the advancement of data held in each FIFO 38a–38c to the outputs 39a–39c of each control blocks 37a–37c, respectively. SCP 25 also is connected by control line 27 to APG 41, to control the output 39d of algorithmic patterns to MUX 43. SCP 25 also is connected by selection line 40 to MUX 43 to control the selection of combined bit patterns on bus 44. During operation of system 10, as each executable instruction in test sequence program 60a is received by SCP 25, the instruction is decoded by SCP 25. SCP 25 determines the output bits required from each PCL 37a–37c and APG 41 during that execution cycle. Based on this determination, SCP 25 advances the appropriate bits from each of PCLs 37a–37c and APG 41 to the outputs 39a–39c, by sending an advance signal on control line 29 and control line 27, respectively. SCP 25 then determines and outputs a selection code on control bus 40 to MUX 43. The selection code corresponds to the test pattern specified for each pin of DUT 70 and causes the selection of the appropriate bits from each of the pattern control blocks 37a–37c and APG 41. As an example, if MUX output bus 44 is 32 bits wide (and having bit positions of bit-0 through bit-31), an instruction may specify bit-0 as a scan bit from SPL control block 37a and bit1-bit31 as analog bits from APL control block 37b. Therefore, an advance signal on bus 29 is sent to output 1 bit from SPL block 37a and 31 bits from APL block 37b. SCP 25 then sends a selection code to select the bits output from SPL block 37a and APL block 37b to form a combined output pattern from MUX 43, in this case, combining bit-0 from SPL block 37a and bit1–bit31 from APL block 37b.

The combined bit pattern output on bus 44 is input to event logic block 45. Event logic 45 also receives functional control signals on line 46 from SCP 25. The functional signal reflects the operational characteristics of the output signal required for each pin of DUT 70 connected to output channel 50. Event logic 47 forwards a digital signal pattern on bus 48 and a conditioning signal on bus 46a to pin electronics 49 (PE 49). The digital signal pattern on bus 48 is based on the required timing of DUT 70. PE 49 then "conditions" the received digital signal pattern according to the conditioning signal on bus 46a, e.g., amplifying the voltage of the output signal, and/or converting the digital signal pattern into an analog output signal and/or adjusting the timing of an output signal required by a pin, or set of pins, of DUT 70.

The conditioned output signals from PE 49 to DUT 70 are output on signal channel 50, which is connected to DUT pins 70a–70d. As test patterns are output to DUT 70, test results may be input to SCL 20 on input channel 51 connected to DUT 70 at pin 70e. The received results are then sent over bus 49a and stored in results cache 31. When results cache 31 has stored a full page of results, results cache 31 sends a write request to MIPRS 29 to write the page of results to memory 60. The results stored in memory 60 may later be retrieved by front end processor 65 or SCP 25. The results received may be used by SCP 25 during execution of program 60a to determine the flow of instruction executed from program 60a (e.g., making a branch determination based on a received result)

Memory 60 may be used to store many types of test data sets and/or test programs, each potentially corresponding to a different type of test pattern. For example, the types of data sets may include Functional Data ("F-Data"), Scan data and Digitized-Analog data. However, any type of data that may be represented in a digital format may be stored and read from memory 60.

Link tables associated with a particular data set 60b–60n may be stored in memory 60 along with the data set. Link tables include pointers to different segments of a data set and allow a data set to be stored and then read from memory 60 in a non-linear fashion. In this case, a particular PCL 37a–37c may request and store link tables in their associated FIFO registers 38a–38c, the stored link tables may be used to access segments of a data set stored in memory 60 and organized based on those link tables.

Multi-purpose memory 60 may be a 'PC-standard' memory, i.e., a memory that is configured to operate according to PC-standard communication protocol. In this case, memory 60 may be replaced by another PC-standard memory. Also, memory 60 may be configured using a multiple-chip set that is addressable by a single address/data bus 61 and MIPRS 29, for example, memory 60 may be implemented as a "Dual-In-Line-Memory" (DIMM). In general, any physical or electrical memory configuration may be used that is capable of being accessed as a single unified memory address space.

Figure 2:
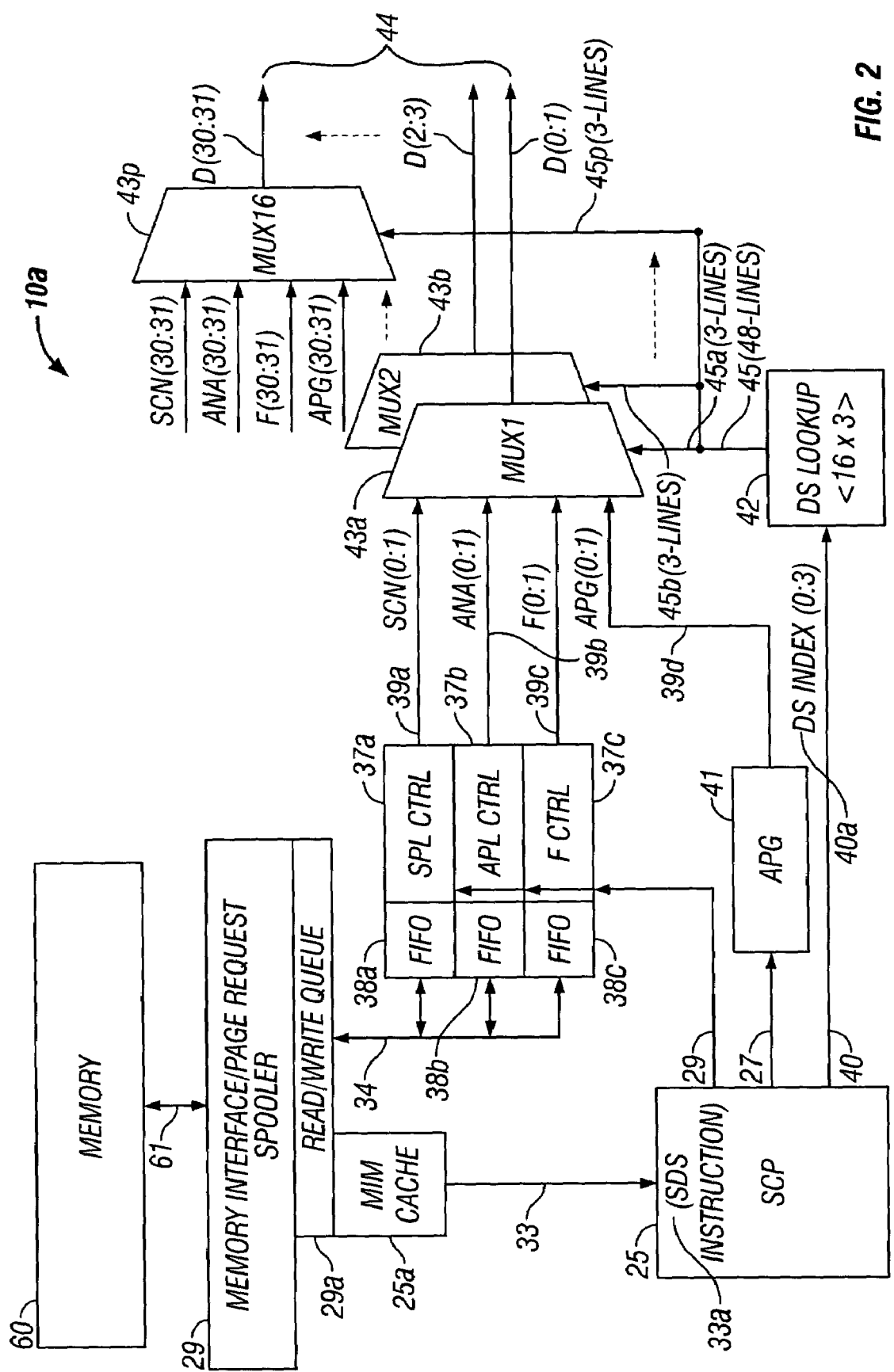
FIG. 2 is a block diagram showing a second embodiment of an integrated circuit testing system.

Referring to FIG. 2, an alternate embodiment of testing system 10 includes Data Selection Logic 10a (DSL 10a). DSL 10a depicts an alternative way of selecting and distributing a combined bit pattern from PCLs 37a–37c and APG 41. In some cases, the number of output lines from a set of pattern control logic blocks, such as PCL 37a–37c and APG 41, may exceed the input line capacity of a single multiplexor, such as MUX 43. Therefore, DSL 10a enables a relatively large number of inputs to be multiplexed using multiple multiplexors 43a–43p that are controlled by the outputs of a data selection lookup logic block 42 (DSLLB 42). In more detail, each PCL 37a–37c and APG 41 outputs thirty-two (32) bits of data on buses 39a–39d, respectively. Sixteen (16) selection multiplexors 43a–43p, are connected to receive two (2) bits, respectively, from each output bus 39a–39d of PCL 37a–37c and APG 41. Each MUX 43a–43p is then selected to output two (2) bits on sixteen (16) output buses D(0:1)–D(30:31), respectively, to form a combined bit pattern on bus 44. In order to select the appropriate combined bit pattern on bus 44, DSLLB 42 is loaded with an indexed lookup table prior to the execution of test sequence program 60a. DSLLB 42 is connected to receive a 4-bit data selection index 40a (DS Index 0:3) from SCP 25 on line 40, and then output a 3-bit selection code to each MUX 43a–43p on selection buses 43a–43p, respectively. Data selection index 40a corresponds to a portion of the operand field of an SDS instruction 33a fetched from memory 60 during operation of system 10. In this case, SCP 25 decodes the SDS instruction and outputs a corresponding four-bit data selection index 40a (DS Index (0:3)) to DSLLB 42. DSLLB 42 uses the received four-bit 'DS Index' to index into the stored lookup table and output sixteen (16) separate three-bit selection codes, each three-bit code on separate selection buses 45a–45p, to each MUX 43a–43p, respectively.

This way of controlling multiple multiplexors with an indexed lookup table allows an executable instruction having a relatively short opcode field to control a relatively large number of multiplexors. In this case, an SDS instruction is assembled and represented by the four-bit (4) opcode field and used to select sixteen 3-bit selection codes that are output from DSLLB 42 on lines 45a–45p, respectively. This provides an advantage since a relatively small opcode is used to generate enough individual selection codes to control multiple multiplexors.

The combined bit pattern 44 may be divided and distributed to different physical portions of an integrated circuit, or, to different circuit boards. For example, the thirty-two (32) bits of output bus 44 is divided into two (2) sixteen-bit groups, D(0–15) and D(16–31), respectively, that are each distributed to different circuit boards or integrated circuits. This may be the case where the amount of logic required to control thirty-two (32) bits of test pattern exceeds the circuit capacity of a single integrated circuit or circuit board.

Figure 3:
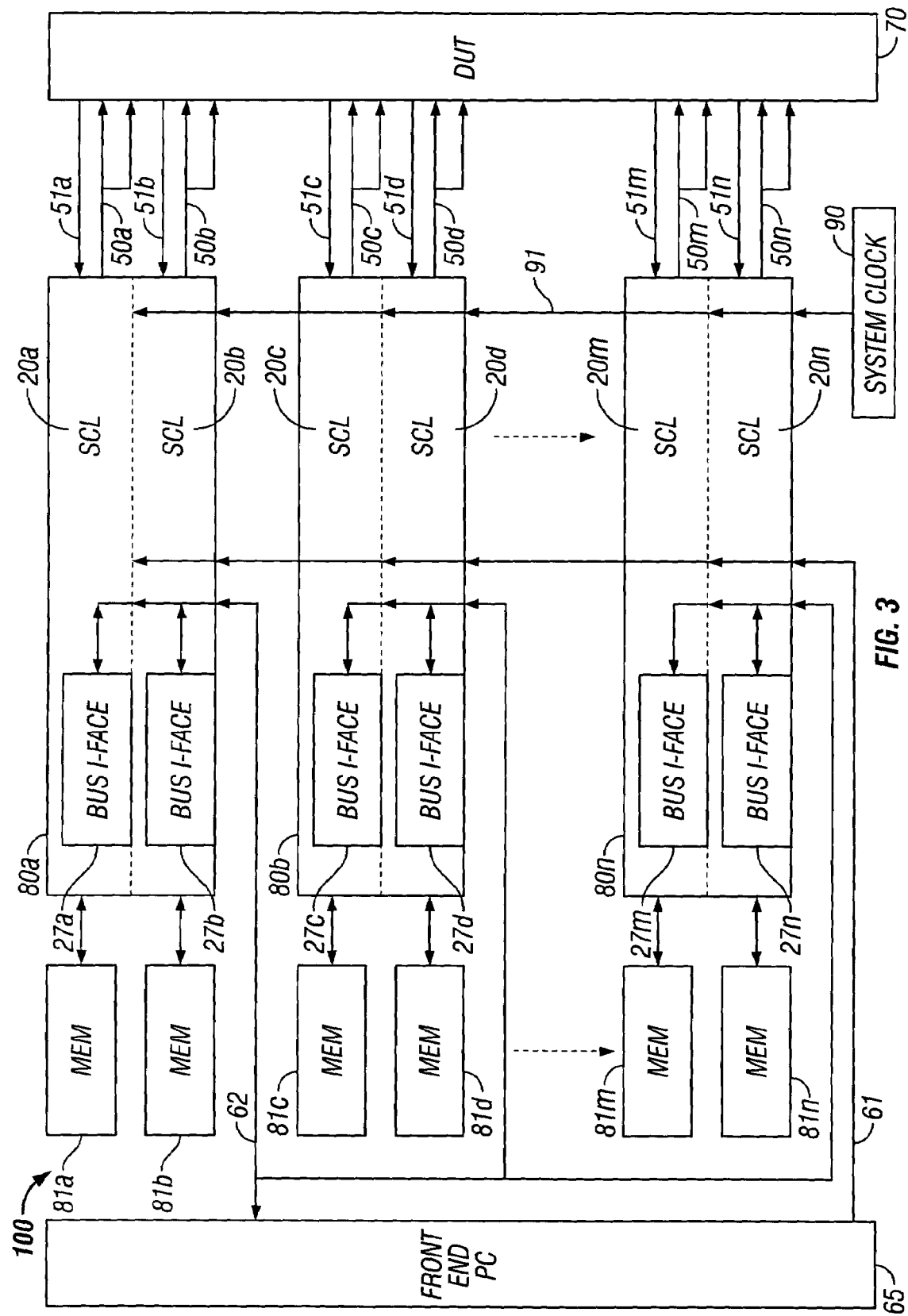
FIG. 3 is a block showing a third embodiment of an integrated circuit testing system.

Referring to FIG. 3, a third embodiment of an integrated circuit testing system 100 includes several test sequencer boards 80a–80n, each of which includes multiple sequence control logic blocks (SCL) 20a–20b, 20c–20d and 20m–20n, respectively. Each SCL 20a–20n is connected to a set of input/output pins of DUT 70 via input channels 51a–51n and output channels 50a–50n. Each SCL 20a–20n is connected to an associated multi-purpose memory 81a–81n that operates in a similar fashion to memory 60 described previously, i.e., each memory 81a–81n is used to hold a test sequence program and multiple data sets that are used to output test patterns to DUT 70. System 100 includes front end processor 65 (FEP 65) that is connected by a control bus 61 and a data bus 62 to each of the SCLs. Data bus 62 is connected in a "daisy-chain" fashion to a bus interface block 27a–27n included in each SCL 20a–20n, respectively. Each bus interface block 27a–27n is connected to associated memories 81a–81n.

During operation of system 100, FEP 65 loads executable test sequence programs over bus 62, through the bus interface blocks 27a–27n and into the associated memories 81a–81n. The executable programs and test data sets loaded into each memory 81a–81n are appropriate for each pin connected to each SCL processor 20a–20n, respectively.

FEP 60 then issues "START" signals to each SCL over control bus 61 to start the execution of the test programs.

FEP 65 may send a synchronization ("SYNCH") signal on bus 61 to two (or more) SCL processors to synchronize the operations of the two SCL processors during testing of DUT 70. To coordinate the synchronized operation of multiple SCLs, system 100 may also include a system clock 90 that is connected to each SCL processor by clock line 91.

Control bus 61 may be bi-directional and allows FEP 65 and each SCL 20a–20n to send and receive coordination signals from each other. For example, SCL 20a may receive a test output on input channel 51a during testing that is determined to be a failed test result. SCL 20a may then send a coordination signal to indicate that determined failure on control bus 61 to another SCL, such as SCL 20c. SCL 20c may use the received result from SCL 20a to determine the execution flow of its own test sequence program, or to halt execution of its test sequence program.

Unified memory 60 need not necessarily be used for all of the separate pattern specific logic blocks in the testing system. Rather, a unified memory could serve any combination of two or more separate pattern-specific logic blocks, while still other logic blocks could have dedicated memories and/or share a separate unified memory address space.

The process (or method) of testing an integrated circuit in the described embodiments is not limited to use with the hardware and software of FIGS. 1–3. The process, hereafter referred to as process 200, may find applicability in any computing or processing environment. Process 200 may be implemented in hardware, software, or a combination of the two. Process 200 may be implemented in computer programs executing on programmable computers or other machines that each include a processor and a storage medium readable by the processor.

Other embodiments not described herein are also within the scope of the following claims.

What is claimed is:

1. An apparatus for testing an integrated circuit, the apparatus comprising:
    a sequence control logic unit having an output channel connectable to a device under test, the sequence control logic unit including a plurality of pattern control logic blocks; and
    a memory to store at least two types of data sets, each data set being used by the sequence control logic unit to determine a test pattern to output on the output channel, wherein a first pattern control logic block in the plurality of pattern control logic blocks is coupled to the memory and is configured to output a first test pattern based on data received from a first data set stored in the memory, and wherein a second pattern control logic block in the plurality of pattern control logic blocks is coupled to the memory and is configured to output a second test pattern based on data received from a second data set stored in the memory the first data set being of a different type than the second data set.

2. The apparatus of claim 1, wherein the memory is further configured to store at least one test sequence program comprising instructions executable by the sequence control logic unit, wherein, during operation of the apparatus, the test sequence program is executed by the sequence control logic unit.

3. The apparatus of claim 2, wherein the sequence control logic unit further comprises:
    a memory interface having a read/write queue connected to receive memory access requests from at least two separate requestors.

4. The apparatus of claim 3, wherein the sequence control logic unit further comprises an instruction cache connected to receive and to hold executable instructions from the memory interface.

5. The apparatus of claim 3, wherein the sequence control logic unit further comprises:
    a plurality of data buffers, each data buffer being associated with a requester, each data buffer to store data received from the memory interface.

6. The apparatus of claim 3, wherein the memory is further configured to store test results received from the device under test.

7. The apparatus of claim 6, further comprising:
    a results cache to store test results received from the device under test.

8. The apparatus of claim 3, further comprising a front end processor connected to the memory interface, the front end processor to load the data sets and the executable test sequence programs prior to the execution of the program.

9. The apparatus of claim 3, further comprising:
    a second sequence control logic unit having a second output channel that is connectable to input pins of a device under test; and
    a second memory to store at least one type of data set and a second executable test program, each data set stored in the second memory usable by the second sequence control logic unit to determine a test pattern to be output on the second output channel.

10. The apparatus of claim 9, further comprising a control line connecting the front end processor and the first and second sequence control logic units,
    wherein, during operation of the apparatus, the control line is used to send a synchronization signal to both the first and second control units to coordinate execution of the first and second test sequence programs and to coordinate output of test patterns to a single device under test connectable to the output channels of the first and second sequence control units.

11. The apparatus of claim 3, wherein the at least two separate requestors include the first pattern control logic block and the second pattern control logic block, the memory interface uses a base address of the first data set to provide data from the first data set to the first pattern control logic block, and the memory interface uses a base address of the second data set to provide data from the second data set to the second pattern control logic block.

12. The apparatus of claim 1, wherein the types of the first and second data sets each are one of functional data, scan data, or digitized analog data.

13. The apparatus of claim 1, wherein the sequence control logic unit further comprises:
    a plurality of selection multiplexors each to receive at least one output bit from one or more of the plurality of pattern control logic blocks; and
    a data selection logic block to control an output of each of the plurality of selection multiplexors.

14. An apparatus comprising:
    a sequence control logic unit having an output channel connectable to a device under test, the sequence control logic unit including a plurality of pattern control logic blocks, a plurality of selection multiplexors, and a data selection logic block to control an output of each of the plurality of selection multiplexors; and
    a memory to store at least two types of data sets, each data set being used by the sequence control logic unit to determine a test pattern to output on the output channel, wherein a first pattern control logic block in the plurality of pattern control logic blocks is coupled to the memory and is configured to output a first test pattern based on data received from a first data set stored in the memory, wherein a second pattern control logic block in the plurality of pattern control logic blocks is coupled to the memory and is configured to output a second test pattern based on data received from a second data set stored in the memory, the first data set being of a different type than the second data set, wherein the plurality of selection multiplexors receives at least one output bit from one or more of the plurality of pattern control logic blocks, and wherein the data selection logic block determines selection codes for each of the plurality of selection multiplexors based on a portion of an instruction stored in the memory as part of a test sequence program.

15. The apparatus of claim 14, wherein the data selection logic block includes an indexed table, and
wherein the data selection logic block is connected to receive an index based on the portion of the instruction.

16. An article comprising:
a storage medium having stored thereon instructions that when executed by a machine result in the following:
storing at least two types of data sets in a memory, each data set usable by a sequence control logic unit to determine a test pattern to be output by one or more output channels that are connectable to input pins of a device under test;
outputting at least part of the test pattern to the one or more output channels from a first pattern control logic block based on data received from a first data set stored in the memory; and
outputting at least part of the test pattern to the one or more output channels from a second pattern control logic block based on data received from a second data set stored in the memory, wherein the first data set is of a different type than the second data set.

17. The article of claim 16, wherein storing further comprises:
storing at least one test sequence program in the memory, the test sequence program comprising instructions executable by the sequence control logic unit.

18. The article of claim 17, wherein the instructions when executed by a machine further result in the following:
queueing memory access requests from a plurality of requestors at an interface to the memory.

19. The article of claim 18, wherein the instructions when executed by a machine further result in the following:
storing instructions received from the memory interface in an instruction cache.

20. The article of claim 18, wherein the instructions when executed by a machine further result in the following:
storing data received from the memory interface in a plurality of data buffers, each data buffer being associated with a one of the plurality of requestors.

21. The article of claim 18, wherein the instructions when executed by a machine further result in the following:
storing test results received from the device under test in the memory.

22. The article of claim 21, wherein storing further comprising:
storing test results received from the device under test in a results cache; and
writing the stored test results from the results cache to the memory.

23. The article of claim 18, wherein the plurality of requestors includes the first pattern control logic block and the second pattern control logic block, the memory interface uses a base address of the first data set to provide data from the first data set to the first pattern control logic block, and the memory interface uses a base address of the second data set to provide data from the second data set to the second pattern control logic block.

24. The article of claim 16, wherein the instructions when executed by a machine further result in the following:
receiving at each of a plurality of multiplexors at least one output bit from one or both of the first and second pattern control logic blocks; and
selecting at least one output bit from each of the plurality of multiplexors.

25. The article of claim 24, wherein selecting further comprises:
determining a selection code for each of the plurality of multiplexors based on a portion of an instruction stored in the memory as part of the test sequence program.

26. A method of testing an integrated circuit, the method comprising:
storing at least two types of data sets in a memory, each data set usable by a sequence control logic unit to determine a test pattern to be output by one or more output channels that are connectable to input pins of a device under test;
outputting at least part of the test pattern to the one or more output channels from a first pattern control logic block based on data received from a first data set stored in the memory; and
outputting at least part of the test pattern to the one or more output channels from a second pattern control logic block based on data received from a second data set stored in the memory, wherein the first data set is of a different type than the second data set.

27. The method of claim 26, wherein storing further comprises:
storing at least one test sequence program in the memory, the test sequence program comprising instructions executable by the sequence control logic unit.

28. The method of claim 27, further comprises:
queueing memory access requests from a plurality of requestors at an interface to the memory.

29. The method of claim 28, further comprises:
storing instructions received from the memory interface in an instruction cache.

30. The method of claim 28, further comprises:
storing data received from the memory interface in a plurality of data buffers, each data buffer being associated with a one of the requesters.

31. The method of claim 28, further comprises:
storing test results received from the device under test in the memory.

32. The method of claim 31, wherein storing further comprising:
storing test results received from the device under test in a results cache; and
writing the stored test results from the results cache to the memory interface.

33. The method of claim 28, wherein the plurality of requestors includes the first pattern control logic block and the second pattern control logic block, the memory interface uses a base address of the first data set to provide data from the first data set to the first pattern control logic block, and the memory interface uses a base address of the second data set to provide data from the second data set to the second pattern control logic block.

34. The method of claim 26, further comprising:
receiving at each of a plurality of multiplexors at least one output bit from one or both of the first and second pattern control logic blocks; and
selecting at least one output bit from each of the plurality of multiplexors.

35. The method of claim 34, wherein selecting further comprises:
determining a selection code for each of the plurality of multiplexors based on a portion of an instruction stored in the memory as part of the test sequence program.

* * * * *